(12) United States Patent
Kim

(10) Patent No.: US 7,498,227 B2
(45) Date of Patent: Mar. 3, 2009

(54) METHOD FOR MANUFACTURING A NON-VOLATILE MEMORY DEVICE

(75) Inventor: Jea-Hee Kim, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 361 days.

(21) Appl. No.: 11/205,542

(22) Filed: Aug. 16, 2005

(65) Prior Publication Data

US 2006/0033142 A1     Feb. 16, 2006

(30) Foreign Application Priority Data

Aug. 16, 2004     (KR) ................ 10-2004-0064416

(51) Int. Cl.
*H01L 21/336*     (2006.01)
(52) U.S. Cl. ............ 438/287; 438/288; 438/261; 257/324; 257/E29.309
(58) Field of Classification Search .......... 438/288, 438/261, 287
See application file for complete search history.

(56) References Cited

U.S. PATENT DOCUMENTS 6,798,015 B2 *   9/2004   Kasuya .......... 257/316
2004/0132247 A1 *  7/2004  Kasuya .......... 438/257
2005/0067659 A1 *  3/2005  Gutsche et al. ..... 257/390

FOREIGN PATENT DOCUMENTS

JP     2000-004014 A     1/2000

OTHER PUBLICATIONS

Shoji Yadori et al., Semiconductor Integrated Circuit and Manufacture Thereof, English Abstract of Japanese Patent Publication 2000-004014A, Jan. 7, 2000, Japan Patent Office, Japan.

* cited by examiner

*Primary Examiner*—Jerome Jackson, Jr.
*Assistant Examiner*—Paul A Budd
(74) *Attorney, Agent, or Firm*—Andrew D. Fortney

(57) ABSTRACT

An increase of charge storing capacity, prevention of an over-erase, and a reduction of ΔVth may be achieved when a 2-bit/cell non-volatile memory device includes a gate of a predetermined width above a semiconductor substrate, an insulating layer between the gate and the semiconductor substrate and at lateral sides of the gate, having a greater width than the gate, a pair of storage layers at the lateral sides of the gate, a pair of blocking layers at the lateral sides of the gate and covering the pair of storage layers, a source and a drain formed in the semiconductor substrate at first opposed locations external to the gate, and a trap impurity implanted into the insulating layer at second locations external to the gate.

20 Claims, 3 Drawing Sheets

METHOD FOR MANUFACTURING A NON-VOLATILE MEMORY DEVICE

CROSS-REFERENCE TO RELATED APPLICATION

This application claims priority to and the benefit of Korean Patent Application No. 10-2004-0064416 filed in the Korean Intellectual Property Office on Aug. 16, 2004, the entire contents of which are incorporated herein by reference.

BACKGROUND OF THE INVENTION (a) Field of the Invention

The present invention relates to a non-volatile memory device and a method for manufacturing the same. More particularly, the present invention relates to a non-volatile memory device providing two bits per cell and having an enhanced programming capacity and efficiency, and a method for manufacturing the same.

(b) Description of the Related Art

In a non-volatile memory device (among various semiconductor memory devices), data are not erased even when power is turned off.

At present, the non-volatile memory devices are divided into floating gate memory devices, and MIS (metal-insulator-semiconductor) memory devices in which two or more kinds of dielectric layers are stacked to form a double layer or a triple layer.

The floating gate non-volatile memory devices realize their memory characteristic using a potential well. The MIS non-volatile memory devices realize their memory characteristic using a trap existing in an interface (e.g., a charge trapping or charge storage capability provided by certain materials and/or the interface between them).

For a MIS non-volatile memory device, a silicon-oxide-nitride-oxide-semiconductor (SONOS) structure is widely adopted.

A typical structure of a conventional planar type SONOS device is illustrated in FIG. 1.

As shown in FIG. 1, according to a conventional SONOS device, a first oxide layer 2, a nitride layer 3, and a second oxide layer 4 are stacked on a semiconductor substrate 1 in an oxide-nitride-oxide (ONO) structure 5, and a gate 6 is formed thereabove. A source 7 and a drain 8 are formed in the semiconductor substrate 1 at positions or locations horizontally external to the gate 6.

An advance to such a conventional SONOS structure concerns a 2-bit/cell structure providing two bits per cell, introduced to increase memory capacity with the same gate width.

FIG. 2 is a cross-sectional view of a conventional SONOS device in a 2-bit/cell structure. As shown in FIG. 2, a gate 12 is formed above a semiconductor substrate 10, and a first oxide layer 11 is formed between the gate 12 and the semiconductor substrate 10 and at each lateral side of the gate 12.

A nitride layer 13 is formed lateral to the first oxide layer 11 (that was formed laterally to the gate 12). The gate 12 is further provided with a second oxide layer 14 that covers the nitride layer 13. A source 15 and a drain 16 are formed in the semiconductor substrate 10 at positions horizontally external to the gate 12.

However, charges may not be effectively trapped under all circumstances in such a 2-bit/cell structure since an area for trapping the charges is small.

Furthermore, when the first oxide layer is degraded, charges may escape to the substrate while storing programmed data. In this case, a threshold voltage Vth of the transistor device may be lowered, and thus a ΔVth may decrease. Here, the ΔVth denotes a voltage difference between threshold voltages Vth in a forward bias and a reverse bias. A reduction of ΔVth level may cause a problem of an over-erase, and therefore, the ΔVth is recommended to remain as constant as possible.

The above information disclosed in this Background section is only for enhancement of understanding of the background of the invention, and therefore, it may contain information that does not form prior art that may be already known in this or another country to a person of ordinary skill in the art.

SUMMARY OF THE INVENTION

An exemplary non-volatile memory device according to an embodiment of the present invention includes a gate of a predetermined width above a semiconductor substrate, an insulating layer between the gate and the semiconductor substrate and at lateral sides of the gate, having a greater width than that of the gate, a pair of storage layers at the lateral sides of the gate, a pair of blocking layers at the lateral sides of the gate and covering the pair of storage layers, a source and a drain in the semiconductor substrate at opposite locations external to the gate, and a trap impurity implanted into the insulating layer at second locations external to the gate.

The trap impurity may be near an interface of the semiconductor substrate with the insulating layer, and may comprise nitrogen, germanium, and/or oxygen.

The insulating layer and the blocking layer may each respectively comprise an oxide layer, and the storage layer may comprise a nitride layer.

An exemplary method for manufacturing a non-volatile memory device according to an exemplary embodiment of the present invention includes forming a bottom insulating layer on a semiconductor substrate, forming a gate of a predetermined width on the bottom insulating layer, forming a side wall insulating layer on the gate, implanting a trap impurity into the bottom insulating layer at locations external to the gate, forming a pair of storage layers at lateral sides of the gate, forming a source and a drain in the semiconductor substrate at opposite locations external to the pair of storage layers by ion implantation, and forming a pair of blocking layers at opposite sides of the gate and covering the pair of storage layers.

Implanting the trap impurity may comprise implanting near an interface of the semiconductor substrate with the bottom insulating layer. The trap impurity may be implanted by a thermal diffusion method or a method using plasma.

Implanting the trap impurity may comprise implanting nitrogen at a temperature of 700-900° C. from NO and/or $N_2$ gas, and nitrogen may be implanted from $N_2$ gas in or under an Ar or He plasma atmosphere.

Forming the pair of storage layers may include forming a storage layer material above the semiconductor substrate, and anisotropically etching the storage layer material above the semiconductor substrate so as to form (or leave) the pair of storage layers on the lateral sides of the gate. Such anisotropic etching of the storage layer material may comprise etching the storage layer material until a height of the storage layer becomes lower than that of the gate.

Forming the pair of blocking layers may include forming a blocking layer material above the semiconductor substrate, and anisotropically etching the blocking layer material so as to form (or leave) the pair of blocking layers on lateral sides of the gate. Anisotropically etching the blocking layer material may comprise etching the blocking layer material until the gate is exposed.

DETAILED DESCRIPTION OF THE EMBODIMENTS

An embodiment of the present invention will hereinafter be described in detail with reference to the accompanying drawings.

Figure 1:
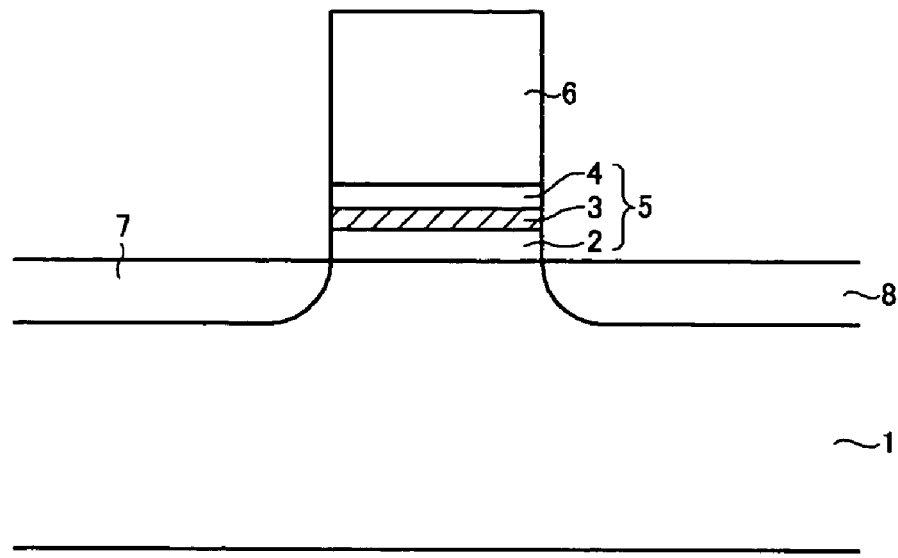
FIG. 1 is a cross-sectional view of a conventional planar type SONOS device.
Figure 2:
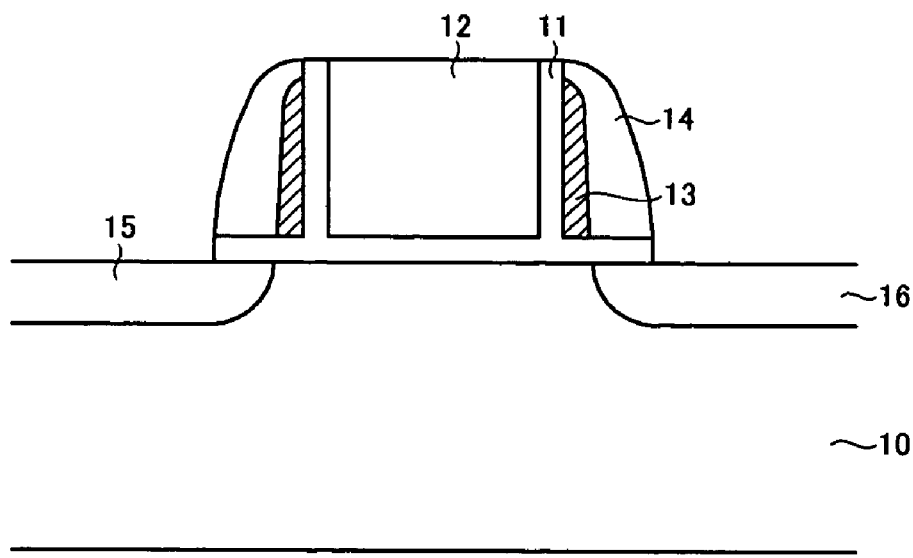
FIG. 2 is a cross-sectional view of a conventional SONOS device in a 2-bit/cell structure.
Figure 3A:
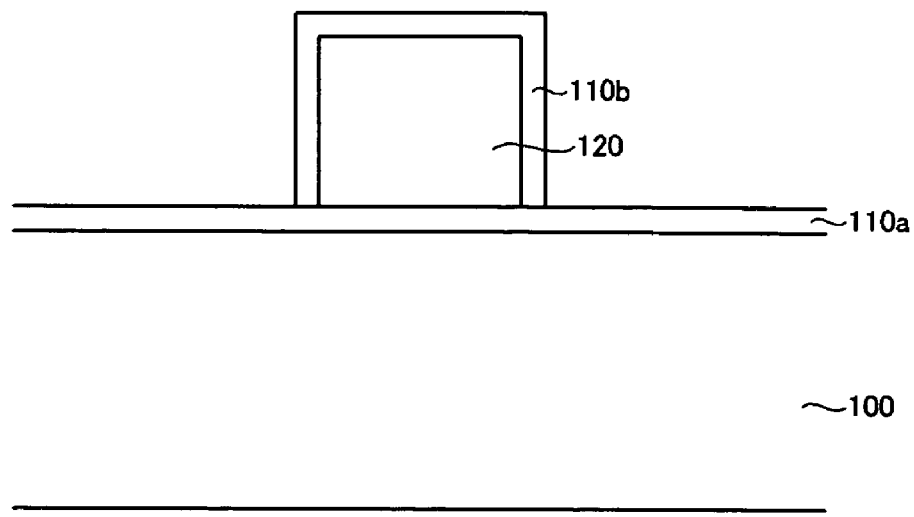
FIG. 3A to 3C are cross-sectional views showing sequential stages of a method for manufacturing a non-volatile memory device according to an exemplary embodiment of the present invention.
Figure 3B:
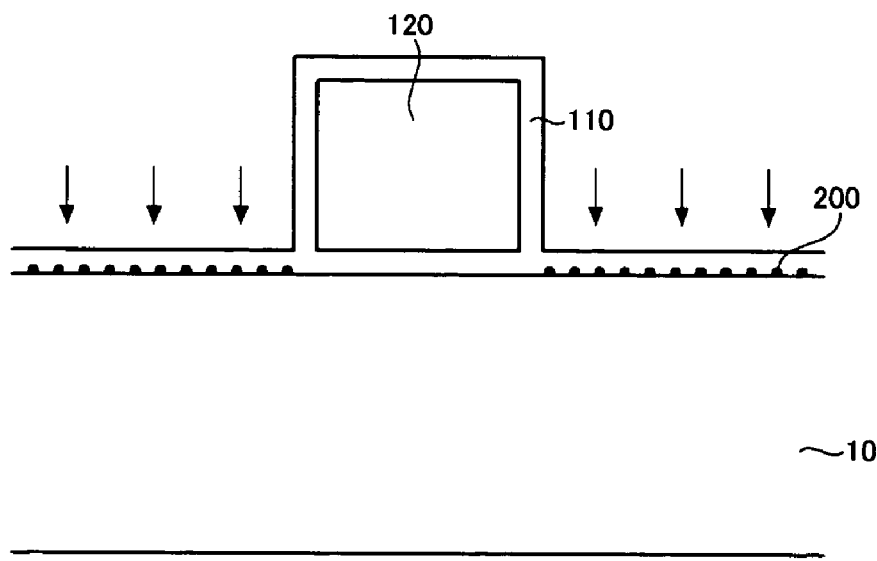
Figure 3C:
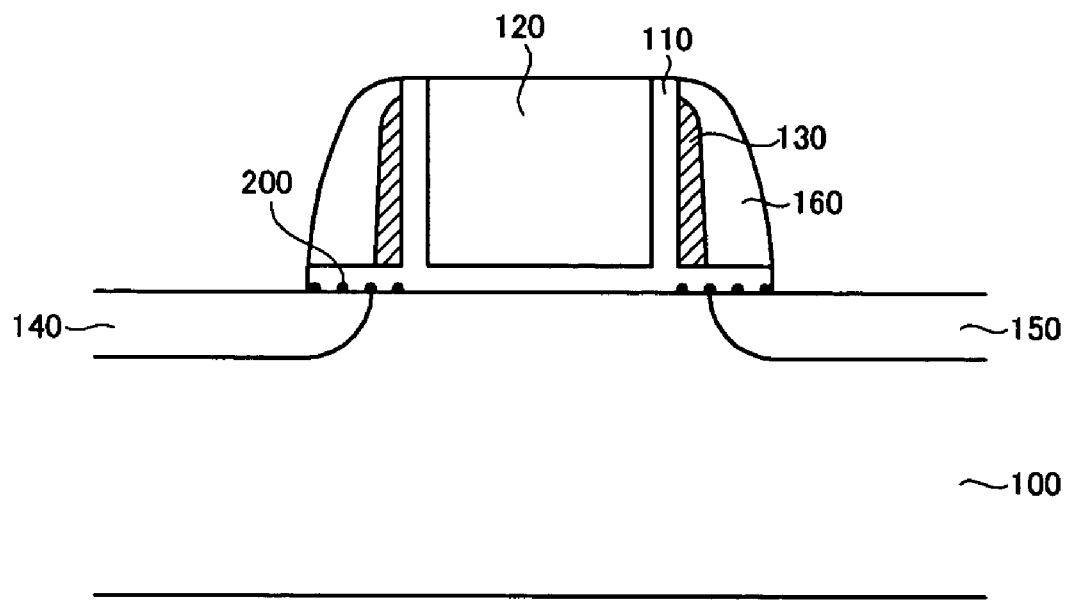

FIG. 3A to 3C are cross-sectional views showing sequential stages of a method for manufacturing a non-volatile memory device according to an exemplary embodiment of the present invention, among which FIG. 3C illustrates a non-volatile memory device according to an exemplary embodiment of the present invention.

As shown in FIG. 3C, a non-volatile memory device according to an exemplary embodiment of the present invention includes a gate 120 of a predetermined width formed above a semiconductor substrate 100.

Further, an insulating layer 110 is between the gate 120 and the semiconductor substrate 100 and at lateral sides of the gate 120. Here, a width of the insulating layer 110 on the semiconductor substrate 100 may be greater than a width of the gate 120, such that the insulating layer 110 protrudes or extends along both lateral directions external to the gate 120.

A storage layer 130, e.g., comprising nitride (such as silicon nitride), is formed at opposed lateral sides of the gate 120. That is, a pair of storage layers 130 are formed for each gate 120.

A blocking layer 160 is formed on each storage layer 130. That is, a pair of blocking layers 160 are positioned at opposed lateral sides of the gate 120, respectively covering the pair of storage layers 130. Typically, gate 120 separates the individual storage layers 130 and blocking layers 160, and an upper surface of gate 120 is exposed before any further materials (other than the corresponding storage layer material and blocking layer material) are subsequently deposited thereon.

A source 140 and a drain 150 are formed in the semiconductor substrate 100 at locations horizontally external to opposed sidewalls of the gate 120. Optionally, the locations of source 140 and drain 150 are substantially aligned with or external to the outer sidewalls of storage layers 130.

A trap impurity 200 such as nitrogen is implanted in the insulating layer 110 at locations horizontally external to the gate 120. The trap impurity 200 breaks bonds of atoms in the insulating layer 110 (that is, it breaks a crystal structure of the insulating layer 110), and trap sites are formed at such positions of broken crystal structure. Therefore, any atoms can be used as the trap impurity 200 if, when implanted into the insulating layer 110, they form a trap site (which may be chemically more unstable than the non-implanted insulating layer 110, due to the implanted impurity atoms breaking the crystal structure of the insulating layer 110). Generally, the implanted atoms cause negligible damage to the insulating layer 110, such that insulating characteristics of the insulating layer 110 are not destroyed or badly affected, and preferably, at least in part, they do not form a stable compound by reacting with the insulating layer 110. For example, nitrogen, germanium, oxygen, combinations thereof, etc. may be used as the trap impurity 200.

In addition, it is preferable that the trap impurity 200 is deeply implanted such that it is also near to an interface of the semiconductor substrate 100 and the insulating layer 110 (i.e., close to the semiconductor substrate 100), as opposed to only at or near an external surface of the insulating layer 110.

The non-volatile memory device becomes a so-called SONOS device when the semiconductor substrate 100 and the gate 120 comprise silicon, the insulating layer 110 and the blocking layer 160 comprise oxide layers, and the storage layer 130 comprises a nitride layer.

Concentration of the trap impurity 200 may vary, depending on the type and/or design of the device to be manufactured. For example, for a SONOS device, nitrogen may be implanted at a concentration of about $10^{22}$ atoms/cm$^3$.

Hereinafter, a method for manufacturing a non-volatile memory device according to an exemplary embodiment of the present invention will be described in detail.

As shown in FIG. 3A, a bottom insulating layer 110a of an insulating material such as an oxide (e.g., undoped silicon dioxide) is firstly formed on the semiconductor substrate 100 (generally by wet or dry thermal oxidation, but alternatively, by chemical vapor deposition), and then a gate 120 is formed at a predetermined width on the bottom insulating layer 110a (generally by deposition of an amorphous silicon layer, which is then crystallized [generally by annealing], patterned by conventional photolithography, and etched by conventional wet or dry etching of polycrystalline silicon).

Subsequently, a side wall insulating layer 110b of an insulating material such as an oxide (e.g., undoped silicon dioxide or a silicon oxide doped with fluorine or with boron and/or phosphorous) is formed on the gate 120. When insulating layer 110b comprises or consists essentially of undoped silicon dioxide, it is generally formed by wet or dry thermal oxidation. However, when insulating layer 110b comprises or consists essentially of a doped silicon oxide, it may be formed by a conventional chemical vapor deposition process. According to an exemplary embodiment of the present invention, the side wall insulating layer 110b and the bottom insulating layer 110a comprise the same material (e.g., undoped silicon dioxide, formed by wet or dry thermal oxidation). In this case, they are generally not differentiable, and hereinafter they are collectively called an insulating layer 110.

Subsequently, as shown in FIG. 3B, the trap impurity 200 is implanted into the insulating layer 110 at locations external to the gate 120. Nitrogen, germanium, oxygen, etc. may be implanted as the trap impurity 200. The trap impurity 200 may be implanted by a thermal diffusion method or a method using plasma.

In more detail, nitrogen may be implanted at a temperature of 700-900° C. from an NO gas, or it may be implanted from, in or under an Ar or He plasma atmosphere further containing an $N_2$ gas.

As described above, it is preferable that the trap impurity 200 is deeply implanted, such that it is also close to an interface of the semiconductor substrate 100 with the insulating layer 110 (i.e., near to the semiconductor substrate 100), rather than only near to or at an external or upper surface of the insulating layer 110. Using known implantation techniques, one may implant an impurity such that its concentration maximum is closer to the semiconductor substrate 100-insulating layer 110 interface than to the upper surface of the insulating layer 110.

According to the thermal diffusion method, it is easy to deeply implant the trap impurity 200 such that its concentration maximum is closer to the interface with the substrate 100 than to the surface of the insulating layer 110. However, the thermal diffusion method has a drawback in that the impurity concentration cannot be precisely controlled. On the other hand, using a plasma method, the trap impurity concentration can be controlled to a desired level, and thus the method using plasma is more accepted.

Other process conditions, such as a chamber pressure, for implanting the trap impurity 200 may be set depending on the implantation apparatus used.

Subsequently as shown in FIG. 3C, a storage layer 130, such as a nitride (e.g., silicon nitride) layer, is formed on each opposed, lateral side of the gate 120. In more detail, the material for storage layer 130 may be deposited on the entire semiconductor substrate 100, and then the storage layer material may be anisotropically etched to leave the pair of storage layers 130 at the lateral sides of the gate 120. In this case, the storage layer material is anisotropically etched until a height of the storage layer 130 becomes smaller than that of the gate 120.

Subsequently, the source 140 and the drain 150 are formed by ion implantation in the semiconductor substrate 100 at opposite locations external to the gate 120 and the storage layer 130. Thus, the source 140 and drain 150 may be substantially aligned with external sidewalls of the two storage layers 130.

Then, a blocking layer 160 is formed at each side external to the gate 120 such that it may cover the storage layer 130. In more detail, the material for blocking layer 160 may be deposited on the entire semiconductor substrate 100, and then the blocking layer material may be anisotropically etched to leave the pair of blocking layers 160 at the lateral sides of the gate 120, covering the two storage layers 130. In this case, the blocking layer 160 is anisotropically etched until the gate 120 is exposed.

According to the above described process, a non-volatile memory device according to an exemplary embodiment is manufactured.

As described above, according to an exemplary embodiment of the present invention, trap sites are formed in an insulating layer under a storage layer by implanting a trap impurity (e.g., impurity atoms that may not completely react with the insulating layer material to form stable compounds). Therefore, charge carriers (e.g., electrons and/or holes) may easily flow into the storage layer through the trap sites, and thus, storing and/or erasing data may become easier. Further, the storage capacity and storage efficiency of a non-volatile memory device may be increased.

In addition, the trap sites may prevent reduction or escape of the charges from the storage layer back to the semiconductor substrate. Therefore, the present invention may reduce or prevent an over-erase condition, an increase of ΔVth, and/or degradation of the insulating layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a non-volatile memory device, comprising:
    forming a bottom insulating layer on a semiconductor substrate;
    forming a gate of a predetermined width on the bottom insulating layer;
    forming a sidewall insulating layer on the gate;
    forming trap sites comprising a trap impurity in the bottom insulating layer at first locations external to the gate;
    forming a pair of storage layers at lateral sides of the gate;
    forming a source and a drain in the semiconductor substrate at second locations external to the pair of storage layers by ion implantation; and
    forming a pair of blocking layers at opposite sides of the gate and covering the pair of storage layers.

2. The method of claim 1, wherein forming the trap sites comprises forming the trap sites near an interface of the semiconductor substrate with the bottom insulating layer.

3. The method of claim 2, wherein the trap impurity has a maximum concentration closer to the interface of the semiconductor substrate with the bottom insulating layer than to an upper surface of the bottom insulating layer.

4. The method of claim 1, wherein the trap impurity comprises nitrogen, germanium, and/or oxygen.

5. The method of claim 1, wherein forming the trap sites comprises thermal diffusion or a plasma method.

6. The method of claim 1, wherein forming the trap sites comprises implanting nitrogen at a temperature of 700-900° C. from NO gas and/or $N_2$ gas.

7. The method of claim 6, wherein forming the trap sites comprises implanting nitrogen from $N_2$ gas in or under an Ar or He plasma atmosphere.

8. The method of claim 1, wherein the insulating layers and the blocking layers each independently comprise an oxide layer, and the storage layers comprise a nitride.

9. The method of claim 1, wherein forming the pair of storage layers comprises:
    forming a storage layer material above the semiconductor substrate; and
    anisotropically etching the storage layer material so as to form the pair of storage layers on the lateral sides of the gate.

10. The method of claim 9, wherein anisotropically etching the storage layer material comprises etching the storage layer material until a height of the storage layer becomes less than that of the gate.

11. The method of claim 1, wherein forming the pair of blocking layers comprises:
    forming a blocking layer material above the semiconductor substrate; and
    anisotropically etching the blocking layer material so as to form the pair of blocking layers on both lateral sides of the gate.

12. The method of claim 11, wherein anisotropically etching the blocking layer comprises etching the blocking layer until the gate is exposed.

13. The method of claim 1, wherein each of the storage layers is capable of independently storing a bit of data.

14. The method of claim 1, wherein forming the trap sites comprises implanting nitrogen at a temperature of 700-900° C. from NO gas.

15. The method of claim 1, wherein the trap sites are chemically more unstable than the bottom insulating layer.

16. The method of claim 1, wherein the trap impurity atoms break the crystal structure of the bottom insulating layer.

17. The method of claim 1, wherein the trap impurity atoms do not form a stable compound by reaction with the insulating layer.

18. The method of claim 1, wherein the trap impurity is nitrogen.

19. The method of claim 18, wherein the trap impurity has a concentration of about $10^{22}$ atoms/cm$^3$.

20. The method of claim 1, wherein the trap sites are formed by a thermal diffusion method.

* * * * *